(12) United States Patent
Koumura

(10) Patent No.: US 6,400,132 B1
(45) Date of Patent: Jun. 4, 2002

(54) CROSS-COIL TYPE INDICATING INSTRUMENT

(75) Inventor: Takashi Koumura, Toyota (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/577,121

(22) Filed: May 24, 2000

(30) Foreign Application Priority Data

Jun. 7, 1999 (JP) .......................................... 11-159699

(51) Int. Cl.$^7$ ................................................. G01R 1/20
(52) U.S. Cl. ........................ 324/146; 324/144; 336/192
(58) Field of Search .................................. 324/144, 145, 324/146, 147, 143, 151–155; 335/222; 336/192

(56) References Cited

FOREIGN PATENT DOCUMENTS

| JP | 9-21655 | 1/1997 |
| JP | 2658519 | 6/1997 |
| JP | 11-14411 | 1/1999 |

Primary Examiner—Jay Patidar
(74) Attorney, Agent, or Firm—Law Offices of David G. Posz

(57) ABSTRACT

A cross-coil type indicating instrument includes a dial plate, a bobbin disposed behind the dial plate, a pair of coils wound around the bobbin to cross each other, a plurality of terminals, a circuit board supported at a rear portion of the dial plate, an indicator shaft, an indicator carried by the indicator shaft, and a permanent magnet disposed in the bobbin coaxially with the indicator shaft. The bobbin has a plurality of terminal holders at the outer periphery thereof. Each terminal has a base portion fixed to the terminal holder, an elongation extending from the base portion toward connection terminals of the coils, and a pressure-contact portion extending from the base portion toward the circuit board to pressure-contact the circuit board from behind by its resilience.

15 Claims, 4 Drawing Sheets

CROSS-COIL TYPE INDICATING INSTRUMENT

CROSS REFERENCE TO RELATED APPLICATION

The present application is based on and claims priority from Japanese Patent Application Hei 11-159699 filed on Jun. 7, 1999, the contents of which are incorporated herein by reference.

BACKGROUND OF THE INVENTION

1. Field of the Invention

The present invention relates to a cross-coil type indicating instrument.

2. Description of the Related Art

In a cross-coil type indicating instrument disclosed in Japan Patent No. 2658519, a printed circuit board is installed inside a driving unit from below. The printed circuit board is connected to terminals via screws which are inserted into the driving unit through the printed circuit board.

However, because the printed circuit board of the above cross-coil type indicating instrument is disposed below the dial plate thereof, it is difficult to satisfy recent demand for a thinner indicating instrument.

JP-A-9-21655 discloses an indicating instrument in which a printed circuit board is disposed between a drive unit and a dial plate.

However, the soldering causes it troublesome to assemble or electrically connect the drive unit and the printed circuit, and to replace them with new ones.

SUMMARY OF THE INVENTION

The present invention has been made to solve the above problem by simplifying the electrical connection between the upper circuit board and the lower drive unit and, also, assembling the upper circuit board and the lower drive unit and replacing those with new ones.

According to a feature of the invention, a cross-coil type indicating instrument is comprised of a dial plate, a housing disposed behind the dial plate, a pair of coils crossing each other, a plurality of terminals respectively disposed in the terminal holders, a circuit board detachably supported by the housing at the side of the dial plate in parallel therewith, an indicator shaft rotatably supported inside the housing, an indicator carried on the indicator shaft, and a permanent magnet carried by the indicator shaft at the middle of the shaft. The dial plate has a plurality of terminal holders at the outer periphery thereof. Each of the plurality of terminals includes a resilient member comprising a base portion fixed to the terminal holder, an elongation extending from the base portion toward a connection terminal that corresponds to one of the coils to be connected thereto, and a pressure-contact portion extending from the base portion toward the circuit board to pressure-contact the circuit board from behind by its resilience.

Thus, each pressure-contact portion is pressure-contacted to the circuit board so that each terminal and circuit board can be connected other than soldering. As a result, electrical connection can be made simply without increasing the number of parts. Assembling and replacement of the housing, the pair of coils, and the circuit board can be carried out easily.

The above cross-coil type indicating instrument can further includes a light source disposed on the front surface of the circuit board to be connectable therewith and a light conducting plate disposed on the back surface of the dial plate to conduct light from the light source to the dial plate.

The first described cross-coil type indicating instrument can further include a light source disposed on the front surface of the circuit board to be connectable therewith, a light conducting plate disposed on the back surface of the dial plate to conduct light from the light source to the dial plate, and an auxiliary plate disposed between the circuit board and the light conducting plate.

In the above stated cross-coil type indicator instrument, the circuit board can include a base board, a foil member, and a conductor member disposed at a portion which corresponds to the pressure-contact portion of each terminal to be connected to the foil member through the base board. Each terminal processor-contacts the base board via a corresponding conductor member.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

First Embodiment

Figure 1:
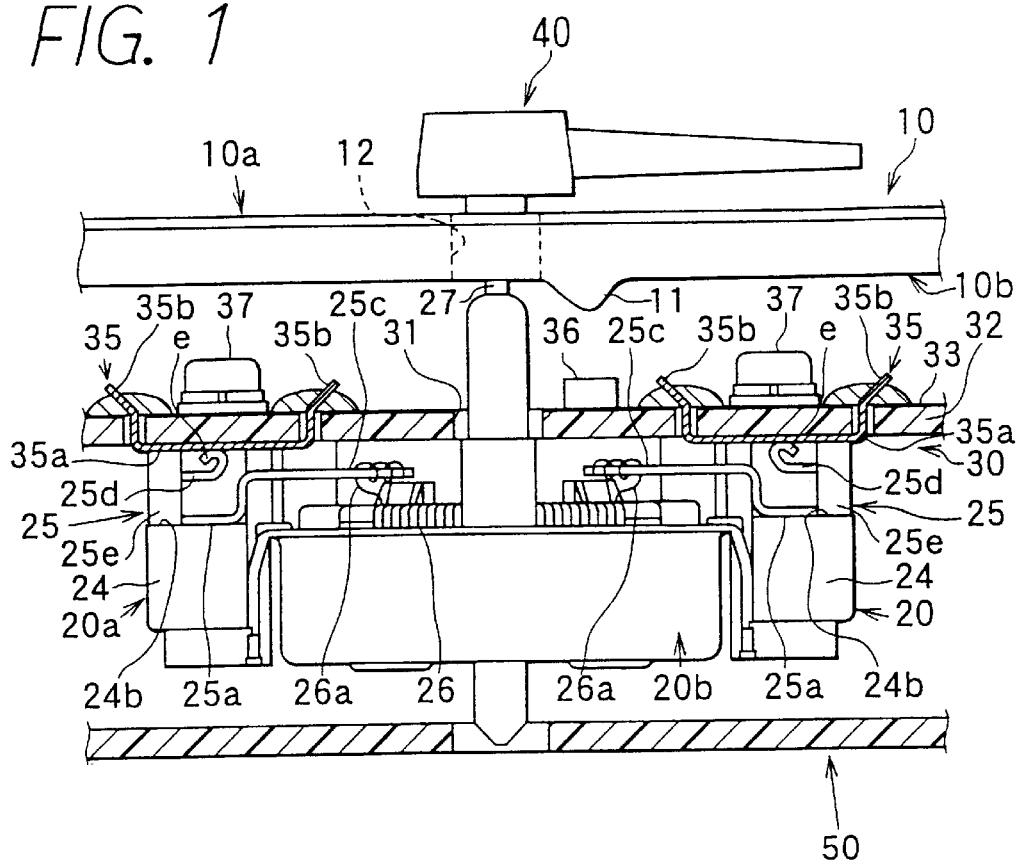
FIG. 1 is a cross-sectional side view cut along line 1—1 in FIG. 2.

A vehicle cross-coil type indicating instrument according to a first embodiment of the invention is described with reference to FIGS. 1–5.

This cross-coil type Indicating instrument is comprised of dial plate unit 10, drive unit 20, printed circuit board 30, indicator 40, and lower casing 50.

Dial plate unit 10 is comprised of transparent dial plate 10a having light conducting plate 10b at the back thereof. Light conducting plate 10b receives light emitted from light emitting element 36 from projection 11, formed at the back, to dial plate 10a to provide a surface light. The surface light permeates dial plate 10a except scale portions which are blackened.

Figure 3:
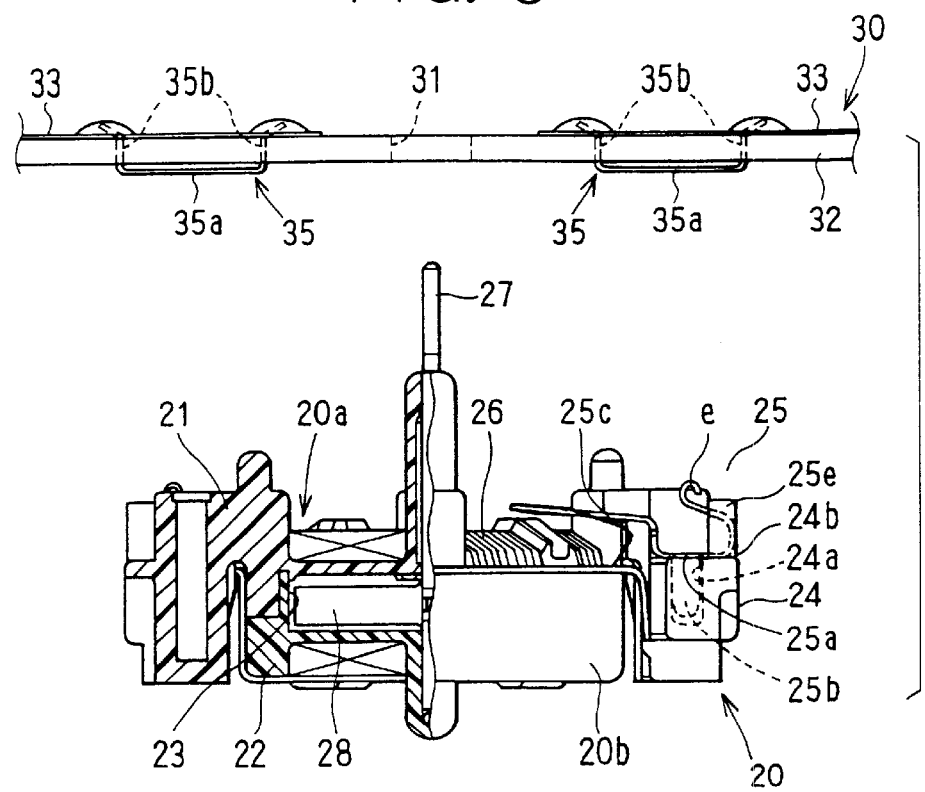
FIG. 3 is an exploded view of a printed circuit board and the drive unit before being assembled.

As illustrated in FIG. 3, drive unit 20 includes hollow bobbin 20a made of resin, which is comprised of a pair of coaxial upper and lower bobbin members 21 and 22. Bobbin 20a is disposed in shield casing 20b. Shield casing 20b has a U-shaped cross-section which is inserted from lower bobbin member 22.

Bobbin 20a has two pairs of terminal holders 24 fixed at the outer periphery of larger hollow portion 23 thereof. The two pairs of terminal holders 24 are respectively disposed in parallel with the axis of bobbin 20a on the outer periphery of larger hollow portion 23 at 180 degree in angle.

Figure 2:
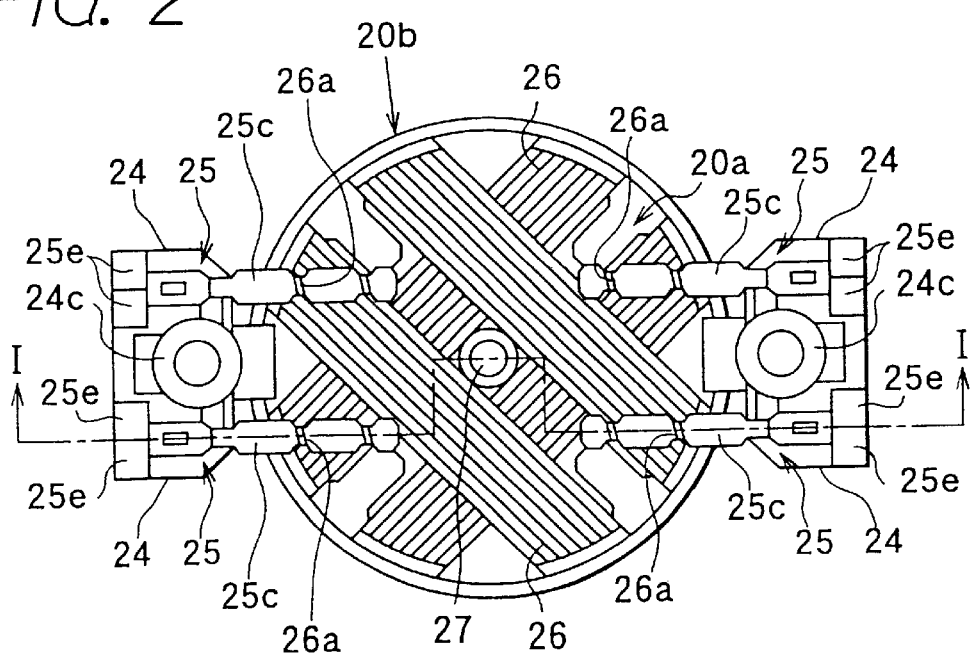
FIG. 2 is a plan view of a drive unit of a vehicle cross-coil type indicating instrument according to a first embodiment of the invention.

As illustrated in FIG. 2, terminal holders 24 of each pair are disposed to be close to each other as a unit.

Bobbin 20a includes terminals 25 respectively fixed to terminal holders 24. Each terminal 25 is formed from a conductive and resilient plate made of such as phosphor bronze.

Figure 5:
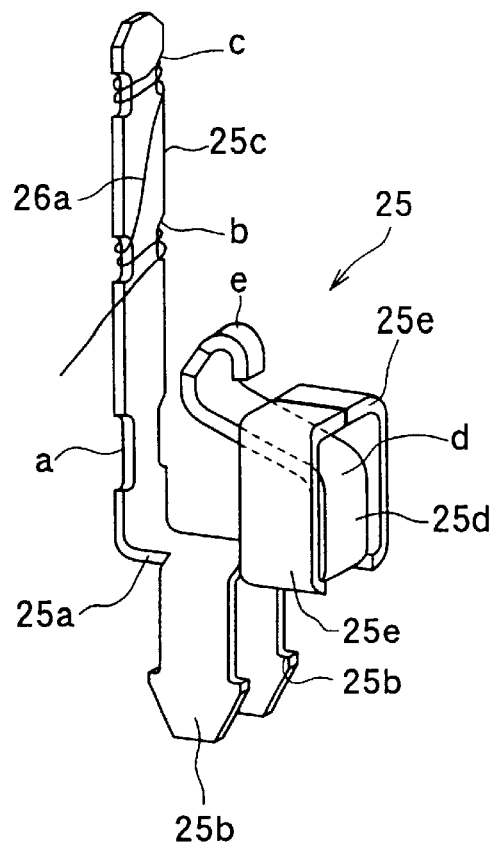
FIG. 5 is an enlarged perspective view of a terminal of the drive unit according to the first embodiment.

As shown in FIG. 5, terminal 25 includes base portion 25a. A pair of legs 25b extends downward from opposite sides of base portion 25a to be parallel with each other. L-shape longitudinal plate-like elongation 25c extends upward from base portion 25a. Elongation 25c has bent portion a—a portion to be bent later—at the lower portion thereof, dummy coil portion b at the middle, and tie-up portion at the upper portion thereof. Bent portion a, dummy coil portion b, and tie-up portion c are formed by cutting opposite sides of elongation 25c into recesses.

As illustrated in FIG. 5, resilient plate portion 25d bends to extend upward from base portion 25a. Resilient plate portion 25d bends at longitudinally middle portion d toward elongation 25c to form a U-shape. Resilient plate portion 25d has upper convex portion e at the upper tip thereof.

As illustrated in FIG. 5, a pair of deform proof portions 25e extends upward from opposite sides of right end of base portion 25a. The pair of deformation proof portions 25e is bent into a U-shape to surround the middle body of resilient plate portion 25d without contact. Convex portion e of resilient plate portion extends left from deformation proof portions 25e.

Figure 4:
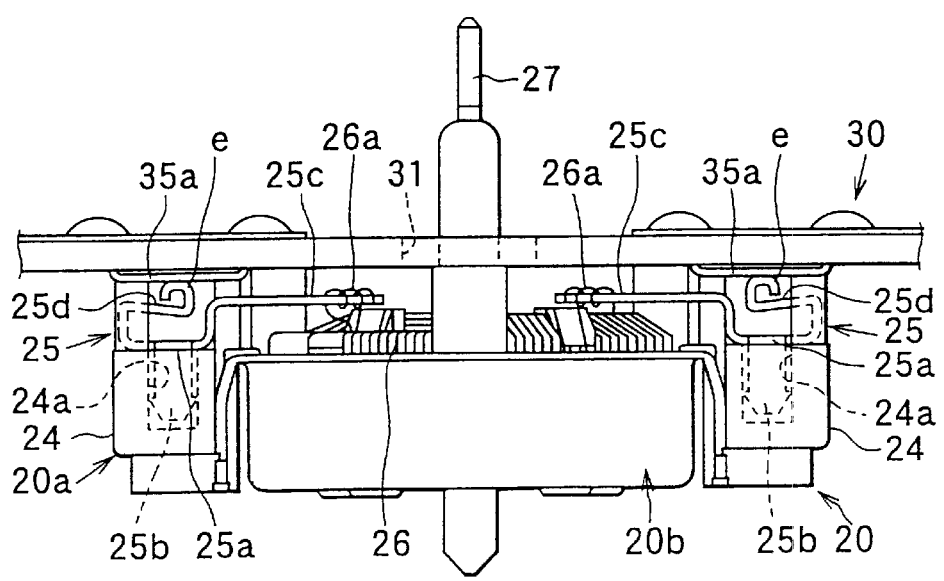
FIG. 4 is a side view of the printed circuit board and the drive unit after being assembled.

As illustrated in FIGS. 3 and 4, the pair of legs 25b of each terminal 25 is inserted into rectangular support hole 24a, which is formed at the center of corresponding one of terminal holders 24. The pair of legs 25b is pressed-fitted to the space between opposite surfaces (opposite inner surfaces in parallel with the radial direction of bobbin 20) of support hole 24a. Because the pair of deformation proof portions 25e surrounds the middle body of the resilient plate portion 25d, it can be utilized as a handle by which the pair of legs 25b of terminal 25 can be inserted into support hole 24a of terminal holder 24, without deforming resilient plate portion 25d.

Each base portion 25a of terminals 25 is seated on upper surface 24b of corresponding one of terminal holders 24. Elongation 25c is positioned left of base portion 25a in FIGS. 3 and 4, and is bent into an L-shape at bent portion a to extend toward the center axis of bobbin 20a.

Resilient plate portions 25d and deformation proof portions 25e are disposed at radially outer side of upper surfaces 24b of terminal holders 24.

A pair of cross-coils 26 is wound around outer periphery of larger hollow portion 23 of bobbin 20a to cross each other at a right angle. Each connection terminal 26a of the pair of cross-coils 26 is tied up at tie-up portion c, wound at dummy-coil portion b, and soldered thereto (FIG. 5).

Indicator shaft 27 is rotatably supported inside bobbin 20a at the center thereof. Permanent magnet 28 is carried by indicator shaft 27 at the middle thereof inside lager hollow portion 23 of bobbin 20a. Permanent magnet 28 is rotated to rotate indicator shaft 27 by composite magnetic field of the pair of cross-coils 26.

Indicator shaft 27 extends from through-hole 12 of dial plate unit 10 through through-hole 31 of printed circuit board 30 to carry the base portion of indicator 40 at the tip thereof.

Printed circuit board 30 is disposed between dial plate unit 10 and drive unit 20 along the upper surface of bobbin 20a in parallel with dial plate unit 10. Printed circuit board 30 is comprised of base board 32, copper foil member 33 formed on base board 32, and four U-shaped conductor members 35.

Each conductor member 35 has connection portion 35a and a pair of L-shaped leg portions 35b extending upward from opposite sides thereof. Each conductor member 35 is fixed to printed circuit board 30 by the pair of leg portions 35b being inserted into holes of printed circuit board 30. The pair of leg portions 35b is soldered to copper foil member 33 at the tips thereof. Connection portion 35a of each conductor member 35 is in contact with the back of printed circuit board 30. Connection portions 35a are respectively disposed opposite the upper surfaces of terminal portions 24 to contact tips e of resilient plate portions 25d.

Light emitting element (such as a light emitting diode) 36 is disposed at the copper. foil member's portion of printed circuit board 30 opposite light projection 11 of light conducting plate 10b. Light from light emitting element 36 enters the inside of light conducting plate 10b from projection 11.

Printed circuit board 30 is fixed to bobbin 20a by screws 37 screwed into female screw-holes formed between each pair of terminals 25, 25. Lower casing 50 is fixed to dial plate unit 10 from below so as to accommodate drive unit 20 and printed circuit board 30.

A method of assembling drive unit 20 and printed circuit board 30 according to the above described first embodiment will be described hereafter.

As illustrated in FIG. 3, printed circuit board 30 is put right above drive unit 20. Then, base board 32 of printed circuit board 30 is pressed against the upper surface of bobbin 20a of drive unit 20 while indicator shaft 27 of drive unit 20 is inserted into through-hole 31 of printed circuit board 30.

At this process, connection portion 35a of each conductor member 35 is brought into contact with tip e of corresponding one of terminals 25 from above, and it is further pressed to press tip portion e downward so that printed circuit board 30 can contact the upper surface of bobbin 20a, as shown in FIG. 4. Thus, connection portion 35a of each conductor member 35 is pressure-contacted to tip portion e of corresponding one of terminals 25.

Accordingly, copper foil member 33 of printed circuit board 30 can be connected to all terminals 25, only by pushing printed circuit board 30 against the upper surface of bobbin 20a without soldering and without increasing the number of parts. Thereafter, printed circuit board 30 is fastened to bobbin 20a by screws 37.

As a result, drive unit 20 and printed circuit board 30 are connected easily without soldering, and drive unit 20 or printed circuit board 30 can be assembled without increasing the thickness of the drive unit or replaced easily.

Since the middle body of resilient plate portion 25d of each terminal 25 is surrounded by deformation proof portion 25e, printed circuit board 30 can be connected to drive unit 20 without exposing resilient plate portions to external deforming force. Therefore, pressure-contact between corresponding conductor members 35 and terminals 25 can be ensured.

Figure 6:
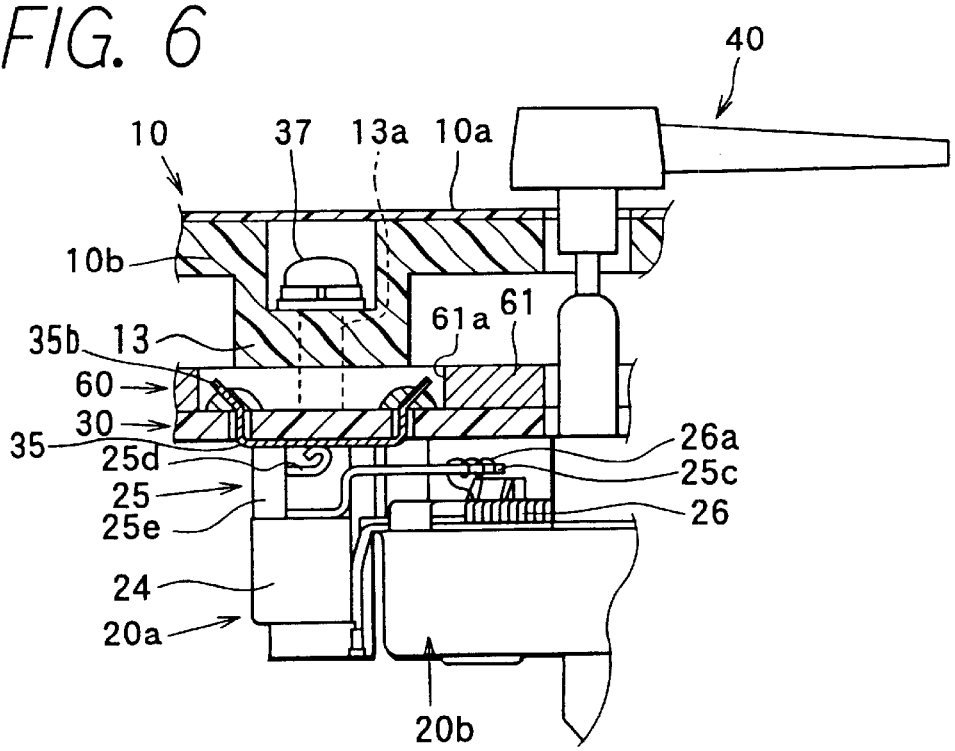
FIG. 6 is a cross-sectional side view illustrating a variation of the first embodiment.

FIG. 6 illustrates a variation of the first embodiment.

In this variation, light conducting plate 10b of dial plate unit 10 has cylindrical portions formed to correspond to female screw holes 24c of bobbin 20a of the first embodiment as shown in FIG. 2. Each cylindrical portion 13 protrudes from the back of light conducting plate 10b.

Auxiliary casing 60 having a U-shaped cross-section is sandwiched between light conducting plate 10b and printed circuit board 30 at bottom wall 61. Auxiliary casing 60 accommodates the lower portion of dial plate unit 10. Light conducting plate 10b is fastened to bobbin 20a by screws 37, which are inserted in through holes 13a of cylindrical portions 13 and screwed into female screw holes 24c, via printed circuit board 30. Reference numeral 61a represents a hole for accommodating the pair of leg portions 35b of conductor member 35. Other structure is the same as the first embodiment.

The variation of cross-coil type indicating instrument according to the first embodiment, in which dial plate unit 10 is fixed to printed circuit board 30 via auxiliary casing 60, can achieve the same effect as the first embodiment.

Second Embodiment

Figure 7:
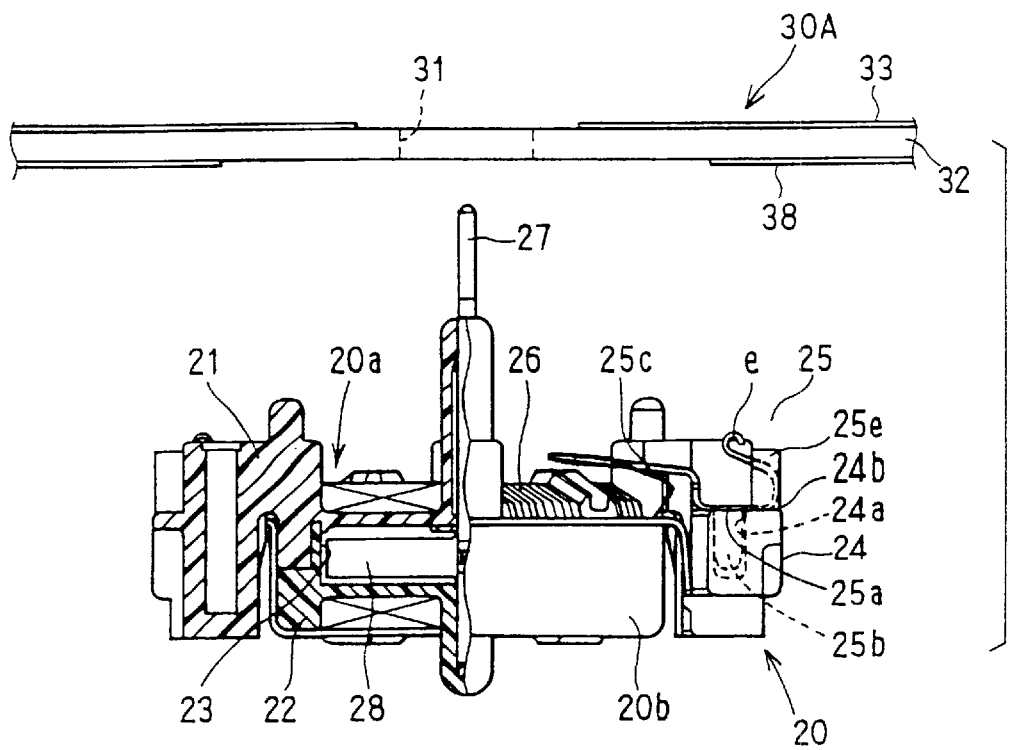
FIG. 7 is a side view of a printed circuit board and a drive unit according to a second embodiment of the invention before being assembled.
Figure 8:
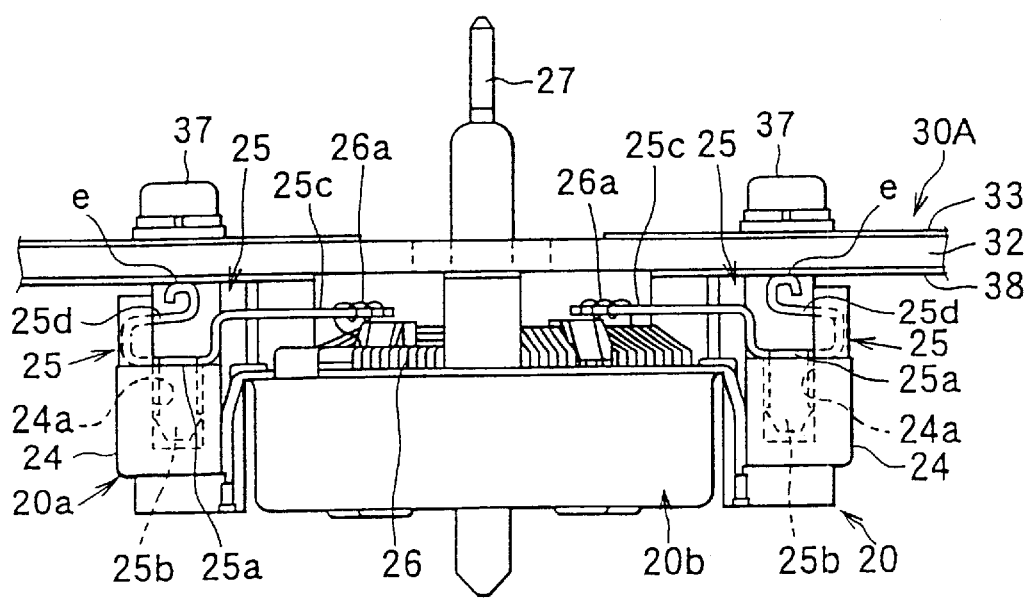
FIG. 8 is a side view of the printed circuit board and the drive unit according to the second embodiment after being assembled.

A cross-coil type indicating instrument according to a second embodiment of the invention is described in FIGS. 7 and 8. Printed circuit board 30A is substituted for printed circuit board 30 of the first embodiment. Printed circuit board 30A has copper foil member 38 on the back of base board 32 and dispenses with conductor members 35 of printed circuit board 30. Other portions are the same as the first embodiment.

A method of assembling printed circuit board 30A into drive unit 20 will be described hereafter.

As illustrated in FIG. 7, printed circuit board 30A is put right above drive unit 20. Printed circuit board 30A is pressed against the upper surface of bobbin 20a of drive unit at copper foil member 38 while indicator shaft 27 is inserted into through-hole 31 of printed circuit board 30A. Copper foil member 38 is brought into contact with tip portion e of terminals 25 from above, and is further moved down to push tip portion e against resilient plate portion 25d until it contacts the upper surface of bobbin 20a of printed circuit board 30A, as illustrated in FIG. 8. Thus, copper foil member 38 can be pressure-contacted with tip portions e of terminals 25.

Accordingly, printed circuit board 30A can be connected to each terminal 25 of drive unit 20 at copper foil member 38 only by pushing printed circuit board 30A against the upper surface of bobbin 20a without soldering. Thereafter, printed circuit board 30A is fixed to bobbin 20a by screws 37.

As a result, drive unit and printed circuit board 30A can be connected easily without soldering, assembled or replaced easily.

Light emitting element 36, which is used as a light source of light conducting plate 10b in the preceding embodiments, can be also used as an element for emitting light to an illuminating indicator via through-hole 12 of drive unit 20. Printed circuit board 30 can be fixed by a fixing member such as a clamp instead of screws.

Instead of printed circuit board 30 or 30A, one of other circuit boards can be used. The cross-coil type indicating instrument according to the invention can be used in the field other than a vehicle.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. A cross-coil type indicating instrument comprising:
    a dial plate;
    a housing disposed behind said dial plate, said housing having a plurality of terminal holders at the outer periphery thereof;
    a pair of coils crossing each other and supported by said housing;
    a plurality of terminals respectively disposed in said terminal holders;
    a circuit board supported by said housing and in parallel with said dial plate;
    an indicator shaft rotatably supported inside said housing to protrude outward through said circuit board and said dial plate;
    an indicator carried by a tip of said indicator shaft to turn in parallel with the surface of said dial plate; and
    a permanent magnet disposed in said housing coaxially with said indicator shaft at the middle of said shaft; wherein
    each of said plurality of terminals comprises a resilient member having a base portion fixed to said terminal holder, an elongation extending from said base portion toward a connection terminal that corresponds to one of said coils to be connected thereto, and a pressure-contact portion extending from said base portion toward said circuit board to pressure-contact said circuit board from behind.

2. The cross-coil type,indicating instrument as claimed in claim 1, further comprising:
    a light source disposed on the front surface of said circuit board to be connectable therewith; and
    a light conducting plate disposed on the back surface of said dial plate to conduct light from said light source to said dial plate.

3. The cross-coil type indicating instrument as claimed in claim 1, further comprising:
    a light source disposed on the front surface of said circuit board to be connectable therewith;
    a light conducting plate disposed on the back surface of said dial plate to conduct light from said light source to said dial plate; and
    an auxiliary plate having a plurality of holes disposed between said circuit board and said light conducting plate.

4. The cross-coil type indicator instrument as claimed in claim 1, wherein
    said circuit board comprises a base board, a foil member, a conductor member disposed at a portion which corresponds to said pressure-contact portion of each of said plurality of terminals to be connected to said foil member through said base board, and
    each of said plurality of terminals pressure-contacts said base board at said pressure-contact portion via corresponding one of said conductor members.

5. The cross-coil type indicator instrument as claimed in claim 1, wherein said circuit board includes a base board and a foil member, and each of said plurality of terminals pressure-contacts said base board at said pressure-contact portion via said foil member.

6. The cross-coil type indicator instrument as claimed in claim 1, wherein each of said plurality of terminals includes a deformation-proof portion which extends from said base portion along opposite sides of said pressure-contact portion to sandwich said pressure-contact portion.

7. The cross-coil type indicating instrument as claimed in claim 1, wherein said base portion of each of said terminal has a leg portion fixedly supported in corresponding one of said plurality of terminal holders.

8. The cross-coil type indicating instrument as claimed in claim 1, wherein said elongation of each of said terminals is bent to extends toward said circuit board of said coils after it is connected to a corresponding one of said connection terminals of said coils.

9. A cross-coil type indicating instrument comprising:

a dial plate;

a bobbin disposed at a back of said dial plate;

a plurality of terminal holders disposed at the outer periphery of said bobbin;

a pair of coils wound around said bobbin to cross each other;

a plurality of terminals respectively disposed in said terminal holders;

a circuit board resiliently fixed to said bobbin, said circuit board having a conductor member at a rear portion thereof;

an indicator shaft rotatably supported inside said bobbin to protrude outward through said circuit board and said dial plate; and a permanent magnet carried by said shaft; wherein each of said plurality of terminals comprises a resilient member having a base portion fixed to said terminal holder, an elongation extending from said base portion toward a connection terminal that corresponds to one of said coils to be connected thereto, and a pressure-contact portion extending from said base portion toward a contact member of said circuit board to pressure-contact said contact member from behind.

10. A drive unit for a light emitting instrument comprising:

a circuit board in electrical communication with the drive unit;

a plurality of terminals in electrical communication with the circuit board;

a bobbin that includes a plurality of terminal holders for receiving the plurality of terminals; and the plurality of terminals each including an electrical connection portion in electrical contact with the circuit board, a resilient portion in pressure communication with a respective holder of the plurality of terminal holders, a structural base portion in structural communication with the respective holder of the plurality of terminal holders, and an extension portion with tie-up receiving indentations.

11. The drive unit as claimed in claim 10, wherein each of the plurality of terminals is in electrical communication with a respective conductor member of the circuit board.

12. The drive unit as claimed in claim 10, wherein the bobbin is detachably connected to the circuit board.

13. The drive unit as claimed in claim 10, wherein the structural base portion of each of the plurality of terminals comprises a pair of leg portions inserted into corresponding support holes in the respective terminal holder.

14. The drive unit as claimed in claim 10, wherein the resilient portion of each of the plurality of terminals comprises a plate portion and a deformation proof portion.

15. The drive unit as claimed in claim 10, wherein the electrical connection portion of each of the plurality of terminals comprises an upper convex portion in electrical communication with the circuit board.

\* \* \* \* \*